United States Patent
Chiu et al.

(10) Patent No.: US 7,049,666 B1
(45) Date of Patent: May 23, 2006

(54) LOW POWER PRE-SILICIDE PROCESS IN INTEGRATED CIRCUIT TECHNOLOGY

(75) Inventors: Robert J. Chiu, San Jose, CA (US); Jeffrey P. Patton, Santa Clara, CA (US); Paul R. Besser, Sunnyvale, CA (US); Minh Van Ngo, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/859,286

(22) Filed: Jun. 1, 2004

(51) Int. Cl.
*H01L 29/94* (2006.01)
*H01L 21/44* (2006.01)
(52) U.S. Cl. .................. 257/384; 257/382
(58) Field of Classification Search ............ 257/384, 257/382, 388, 413, 576; 438/300
See application file for complete search history.

(56) References Cited

U.S. PATENT DOCUMENTS

| 6,531,750 B1 * | 3/2003 | Chan et al. ............ 257/394 |
| 2005/0032393 A1 * | 2/2005 | Weimer ................ 438/769 |

* cited by examiner

*Primary Examiner*—Douglas W Owens
(74) *Attorney, Agent, or Firm*—Mikio Ishimaru

(57) ABSTRACT

A method of forming an integrated circuit with a semiconductor substrate is provided. A gate dielectric is formed on the semiconductor substrate, and a gate is formed on the gate dielectric. Source/drain junctions are formed in the semiconductor substrate. A thin insulating layer is formed over the source/drain junctions. A silicide is formed on the thin insulating layer and on the gate. An interlayer dielectric is deposited above the semiconductor substrate. Contacts are then formed in the interlayer dielectric to the silicide.

17 Claims, 3 Drawing Sheets

900

```
PROVIDING A SEMICONDUCTOR SUBSTRATE
902

FORMING A GATE DIELECTRIC ON THE
SEMICONDUCTOR SUBSTRATE
904

FORMING A GATE OVER THE GATE DIELECTRIC
906

FORMING SOURCE/DRAIN JUNCTIONS IN THE
SEMICONDUCTOR SUBSTRATE
908

FORMING A THIN INSULATING LAYER OVER THE
SOURCE/DRAIN JUNCTIONS
910

FORMING A SILICIDE ON THE THIN INSULATING LAYER
AND ON THE GATE
912

DEPOSITING AN INTERLAYER DIELECTRIC ABOVE THE
SEMICONDUCTOR SUBSTRATE
914

FORMING CONTACTS IN THE INTERLAYER DIELECTRIC
TO THE SILICIDE
916
```

FIG. 9

LOW POWER PRE-SILICIDE PROCESS IN INTEGRATED CIRCUIT TECHNOLOGY

BACKGROUND

1. Technical Field

The present invention relates generally to semiconductor technology, and more specifically to siliciding in semiconductor devices.

2. Background Art

Electronic products are used in almost every aspect of life, and the heart of these electronic products is the integrated circuit. Integrated circuits are used in everything from airplanes and televisions to wristwatches.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

Integrated circuits are made up of hundreds to millions of individual components. One common component is the semiconductor integrated circuit. The most common and important semiconductor technology presently used is silicon-based, and the most preferred silicon-based semiconductor device is a Complementary Metal Oxide Semiconductor (CMOS) integrated circuit.

The principal elements of a CMOS integrated circuit generally consist of a silicon substrate having shallow trench oxide isolation regions cordoning off integrated circuit areas. The integrated circuit areas contain polysilicon gates on silicon oxide gates, or gate oxides, over the silicon substrate. The silicon substrate on both sides of the polysilicon gate is slightly doped to become conductive. The lightly doped regions of the silicon substrate are referred to as "shallow source/drain junctions," which are separated by a channel region beneath the polysilicon gate. A curved silicon oxide or silicon nitride spacer, referred to as a "sidewall spacer", on the sides of the polysilicon gate allows deposition of additional doping to form more heavily doped regions of the shallow source/drain junctions, which are called "deep source/drain junctions". The shallow and deep source/drain junctions are collectively referred to as "S/D junctions."

To complete the integrated circuit, a silicon oxide dielectric layer is deposited to cover the polysilicon gate, the curved spacer, and the silicon substrate. To provide electrical connections for the integrated circuit, openings are etched in the silicon oxide dielectric layer to the polysilicon gate and the source/drain junctions. The openings are filled with metal to form electrical contacts. To complete the integrated circuits, the contacts are connected to additional levels of wiring in additional levels of dielectric material to the outside of the dielectric material.

In operation, an input signal to the gate contact to the polysilicon gate controls the flow of electric current from one source/drain contact through one source/drain junction through the channel to the other source/drain junction and to the other source/drain contact.

Integrated circuits are fabricated by thermally growing a gate oxide layer on the silicon substrate of a semiconductor wafer and forming a polysilicon layer over the gate oxide layer. The oxide layer and polysilicon layer are patterned and etched to form the gate oxides and polysilicon gates, respectively. The gate oxides and polysilicon gates in turn are used as masks to form the shallow source/drain regions by ion implantation of boron or phosphorus impurity atoms into the surface of the silicon substrate. The ion implantation is followed by a high-temperature anneal above 700° C. to activate the implanted impurity atoms to form the shallow source/drain junctions.

A silicon nitride layer is deposited and etched to form sidewall spacers around the side surfaces of the gate oxides and polysilicon gates. The sidewall spacers, the gate oxides, and the polysilicon gates are used as masks for the conventional source/drain regions by ion implantation of boron or phosphorus impurity atoms into the surface of the silicon substrate into and through the shallow source/drain junctions. The ion implantation is again followed by a high-temperature anneal above 700° C. to activate the implanted impurity atoms to form the S/D junctions.

After formation of the integrated circuits, a silicon oxide dielectric layer is deposited over the integrated circuits and contact openings are etched down to the source/drain junctions and to the polysilicon gates. The contact openings are then filled with a conductive metal and interconnected by formation of conductive wires in other interlayer dielectric (ILD) layers.

As integrated circuits have decreased in size, it has been found that the electrical resistance between the metal contacts and the silicon substrate or the polysilicon has increased to the level where it negatively impacts the performance of the integrated circuits. To lower the electrical resistance, a transition material is formed between the metal contacts and the silicon substrate or the polysilicon. The best transition materials have been found to be cobalt silicide ($CoSi_2$) and titanium silicide ($TiSi_2$).

The silicides are formed by first applying a thin layer of the cobalt or titanium on the silicon substrate above the source/drain junctions and the polysilicon gates. The semiconductor wafer is subjected to one or more annealing steps at temperatures above 800° C. and this causes the cobalt or titanium to selectively react with the silicon and the polysilicon to form the metal silicide. The process is generally referred to as "siliciding." Since the shallow trench oxide and the sidewall spacers will not react to form a silicide, the silicides are aligned over the source/drain junctions and the polysilicon gates so the process is also referred to as "self-aligned siliciding," or "saliciding."

However, existing siliciding and saliciding have not succeeded in solving all the problems related to connecting metal contacts to silicon.

The problems include, but are not limited to, limiting diffusion of the silicide into the gate area thereby reducing junction leakage in the transistor.

Solutions to these problems have been long sought but prior developments have not taught or suggested any solutions and, thus, solutions to these problems have long eluded those skilled in the art.

DISCLOSURE OF THE INVENTION

The present invention provides a method of forming an integrated circuit. A method of forming an integrated circuit with a semiconductor substrate is provided. A gate dielectric is formed on the semiconductor substrate, and a gate is formed on the gate dielectric. Source/drain junctions are formed in the semiconductor substrate. A thin insulating layer is formed over the source/drain junctions. A silicide is formed on the thin insulating layer and on the gate. An interlayer dielectric is deposited above the semiconductor substrate. Contacts are then formed in the interlayer dielectric to the silicide.

The thin insulating layer, which preferably is formed using a low power sputter process, such as a low power Argon sputter process, has a thickness of greater than zero and less than about 25 Angstroms. This method significantly reduces diffusion of the silicide into the gate area thereby reducing junction leakage in the transistor.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 9 is a simplified flow chart of the method of manufacturing the silicide in accordance with the present invention.

DETAILED DESCRIPTION OF THE INVENTION

Figure 1:
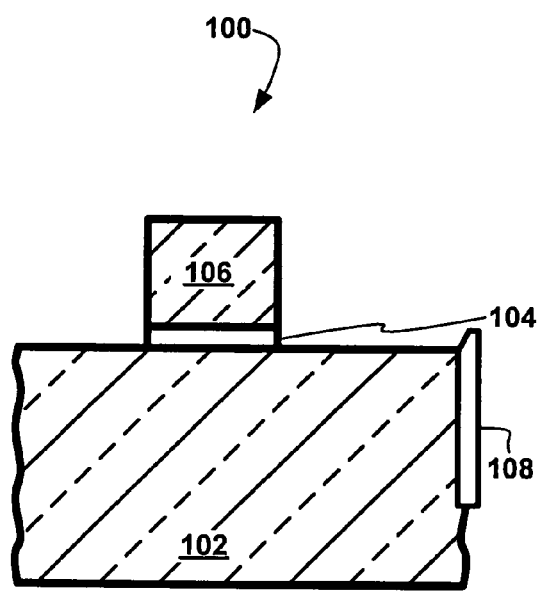
FIG. 1 is a view of an integrated circuit in an intermediate stage of fabrication in accordance with the present invention.

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail. In addition, the drawings showing embodiments of the apparatus are semi-diagrammatic and not to scale and, particularly, some of the dimensions are for the clarity of presentation and may be exaggerated in the drawing FIGs. The same numbers will be used in all the drawing FIGs. to relate to the same elements.

The term "horizontal" as used herein is defined as a plane parallel to a substrate or wafer. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Referring now to FIG. 1, therein is shown an integrated circuit 100 in an intermediate stage of fabrication in accordance with the present invention.

To form the intermediate stage, a gate dielectric layer, such as silicon oxide, has been deposited on a semiconductor substrate 102 of a material such as silicon and a conductive gate layer, such as polysilicon, has been deposited over the gate dielectric layer. The layers are patterned and etched to form a gate dielectric 104 and a gate 106. The semiconductor substrate 102 has been further patterned, etched, and filled with a silicon oxide material to form a shallow trench isolation represented by a STI 108.

Figure 2:
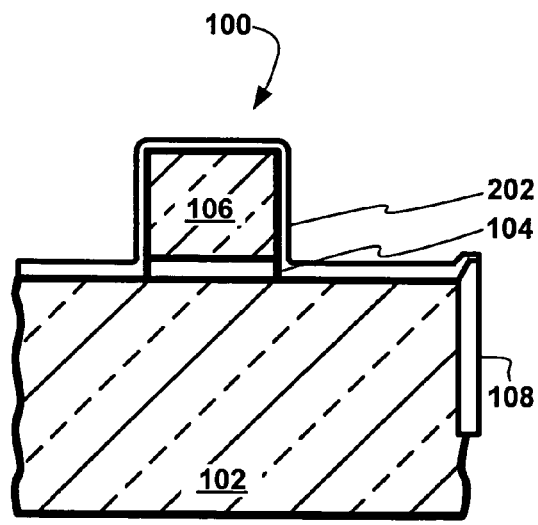
FIG. 2 is the structure of FIG. 1 with a liner layer deposited thereon.

Referring now to FIG. 2, therein is shown the structure of FIG. 1 having a liner layer 202 deposited thereon. The liner layer 202, generally of silicon oxide, covers the semiconductor substrate 102, the gate dielectric 104, the gate 106, and the STI 108. The liner layer 202 can be of an etch stop material or an implant-protection material.

Figure 3:
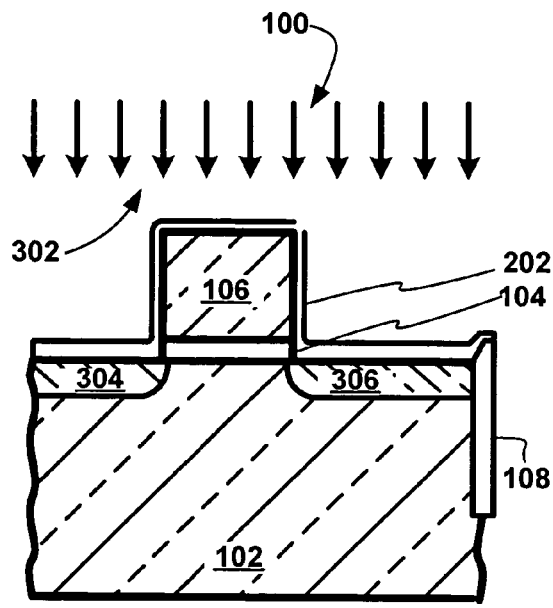
FIG. 3 is the structure of FIG. 2 during ion implantation to form shallow source/drain junctions.

Referring now to FIG. 3 therein is shown the structure of FIG. 2 during an ion implantation 302 to form shallow source/drain junctions 304 and 306.

The gate 106 and the gate dielectric 104 act as masks for the formation of shallow source/drain junctions 304 and 306 by the ion implantation 302 of boron (B) or phosphorus (P) impurity atoms into the surface of the semiconductor substrate 102. The ion implantation 302 is followed by a high-temperature anneal above 700° C. to activate the implanted impurity atoms to form the shallow source/drain junctions 304 and 306.

Figure 4:
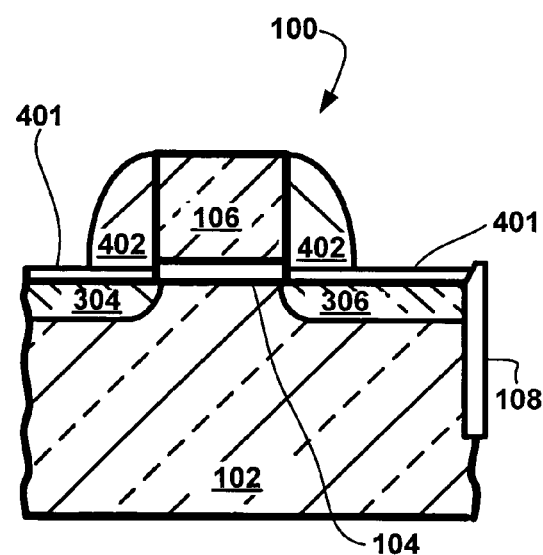
FIG. 4 is the structure of FIG. 3 after formation the structure of FIG. 3 after formation of a thin insulating layer over the source/drain junctions.

Referring now to FIG. 4 therein is shown the structure of FIG. 3 after formation of a thin insulating layer 401 over the source/drain junctions 304 and 306.

It has been discovered that forming the thin insulating layer 401 reduces junction leakage by significantly reducing diffusion of silicide deposited during subsequent steps in the manufacturing process.

Preferably, the thin insulating layer 401 is in the range of greater than zero and less than about 25 Angstroms.

In one embodiment, formation of the thin insulating layer 401 can be accomplished by thinning the liner layer 202 to form the thin insulating layer 401. A sputter process, such as a Argon (Ar) sputter process, is used in two steps to precisely remove material from the liner layer 202 until the desired thickness of the thin insulating layer 401 is formed. In order to obtain precise thickness control, the sputter process starts with power in a range of about 200 to about 250 watts and then drops to a low power range of about 30 to about 35 watts. The total processing time is from about 30 to about 35 seconds, and preferably about 32 seconds. A sidewall spacer layer, generally of silicon nitride, has been deposited and etched to form the curved shape of the sidewall spacer 402 over the thin insulating layer 401.

Figure 5:
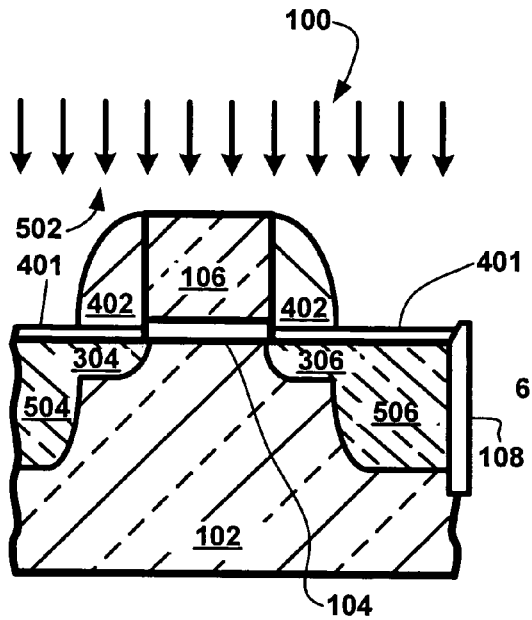
FIG. 5 is the structure of FIG. 4 during ion implantation to form deep source/drain junctions.

Referring now to FIG. 5 therein is shown the structure of FIG. 4 during an ion implantation 502 to form deep source/drain junctions 504 and 506.

The sidewall spacer 402, the gate 106, and the STI 108, act as masks for the formation of the deep source/drain junctions 504 and 506 by the ion implantation 502 of boron or phosphorus impurity atoms into the surface of the semiconductor substrate 102 and into and through the shallow source/drain junctions 304 and 306, respectively. The ion implantation 502 is again followed by a high-temperature anneal above 700° C. to activate the implanted impurity atoms to form the source/drain junctions 504 and 506.

Figure 6:
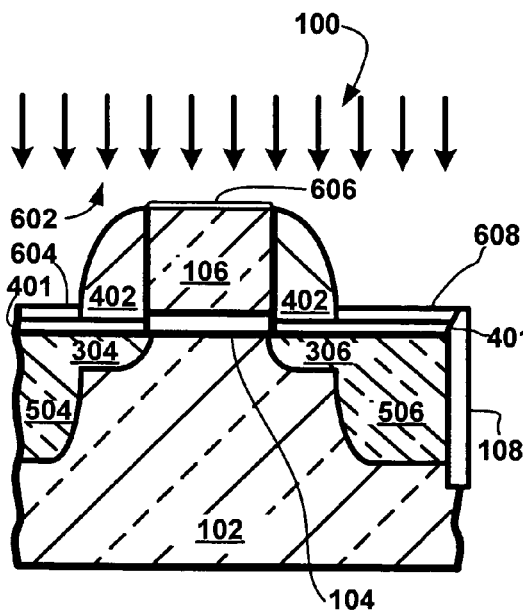
FIG. 6 is the structure of FIG. 5 during the formation of a silicide.

Referring now to FIG. 6 therein is shown a deposition process 602 used in the formation of a layer of a silicide, which are individually referred to as silicides 604, 606, and 608 in accordance with the present invention. The silicides 604 and 606 are formed with the silicon of the semiconductor substrate 102 over the deep source/drain junctions 504 and 506, respectively, and the silicide 608 is formed with the polysilicon of the gate 106.

Generally, there are three ways in which to form a silicide. In one technique, the deposition process 602 deposits a pure metal on exposed silicon areas (both single crystalline and polycrystalline silicon). Thereafter, the metal is reacted with the silicon to form what is known as a first phase, metal-rich silicide. The non-reacted metal is then removed, and the pre-existing first phase product is then reacted again with the underlying silicon to form a second phase, silicon-rich silicide. In a second technique, the deposition process 602 involves co-evaporation of both metal and silicon onto the exposed silicon. Both metal and silicon are vaporized by, for example, an electron beam. The vapor is then drawn onto the wafer and across the silicon. In a third technique, the deposition process 602 involves co-sputtering both metal and silicon onto the silicon surface. Co-sputtering entails physically dislodging metal and silicon materials from a composite target or separate targets, and then directing the composite material onto the wafer.

Conventional salicidation processes have become problematic with modern semiconductor devices that have shallow source/drain junctions, e.g., junction depths on the order of 1000 Angstroms (Å). In particular, during such salicidation processes, some of the existing source/drain regions are consumed.

When cobalt is used as the refractory metal, it consumes about twice its thickness of silicon in the process of being converted to a metal silicide, e.g., a 100 Å layer of cobalt consumes about 103 Å of silicon. Such consumption acts to reduce the dopant present in the source/drain junctions and may adversely impact the electrical performance characteristics of the source/drain junctions, and ultimately, degrades the performance of the integrated circuit.

When the refractory metal is titanium, titanium silicide forms between metal contacts because the sidewall spacer becomes smaller with smaller integrated circuits thereby allowing a capacitive-coupled or fully conductive path between the polysilicon gate and the source/drain junctions, and similarly, degrades the performance of the integrated circuit.

While the present invention may be used with various refractory metal silicides, it has been found that nickel silicide has many desirable characteristics. However, in working with nickel silicide, it has been found to be difficult to form robust nickel. It has been thought that thick silicides around 100 Å thick with rough surfaces would best protect the silicon substrate and provide good adhesion.

However, an ultra-uniform nickel silicide can form extremely robust nickel silicide. By definition, an ultra-uniform silicide means a layer of silicide where there are no variations in thickness greater than about 3% of the overall thickness.

One example of forming ultra-uniform nickel ultra-uniform silicides 604, 606, and 608, is by depositing the nickel on the exposed silicon areas by a very low power vapor deposition process, where the very low power means a power level below 500 watts direct current and preferably between about 400 and 300 watts direct current.

In addition, an extra slow rate of metal deposition is preferred, which is defined to be below 7.0 Å per second and preferably between about 6.8 and 6.0 Å per second.

Still further, it is preferable that the silicide be deposited under these power levels and deposition rates to an ultra-thin thickness of not more than 50 Å thickness in order to provide an ultra-uniform, ultra-thin silicide. The deposited silicide metal is then converted to a silicide by an annealing process, such as a high-temperature anneal around 700° C.

The silicide 604, 606, 608 preferably is formed of a metal selected from the group consisting of cobalt, titanium, nickel, arsenic doped nickel, an alloy thereof, a compound thereof, and a combination thereof.

Figure 7:
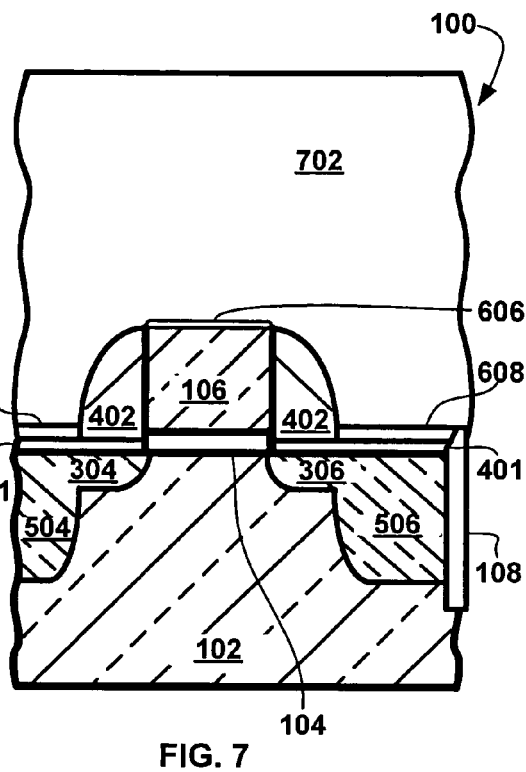
FIG. 7 is the structure of FIG. 6 after deposition of a dielectric layer over the silicide, the sidewall spacer, and shallow trench isolation.

Referring now to FIG. 7 therein is shown the structure of FIG. 6 after deposition of a dielectric layer 702 over the silicide layers 604, 606, and 608, the sidewall spacer 402, and the STI 108.

In various embodiments, the dielectric layer 702 are of dielectric materials such as silicon oxide ($SiO_x$), tetraethylorthosilicate (TEOS), borophosphosilicate (BPSG) glass, etc. with medium dielectric constants from 4.2 to 3.9 or low dielectric constant dielectric materials such as fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilil borxle (SOB), diaceloxyditerliarybutosiloxane (DADBS), trimethylsilil phosphate (SOP), etc. with dielectric constants below 3.9 to 2.5. Ultra-low dielectric constant dielectric materials, having dielectric constants below 2.5 and which are available, include commercially available Teflon-AF, Teflon microemulsion, polimide nanofoams, silica aerogels, silica xerogels, and mesoporous silica. Stop layers and capping layers (where used) are of materials such as silicon nitride ($Si_xN_x$) or silicon oxynitride (SiON).

Figure 8:
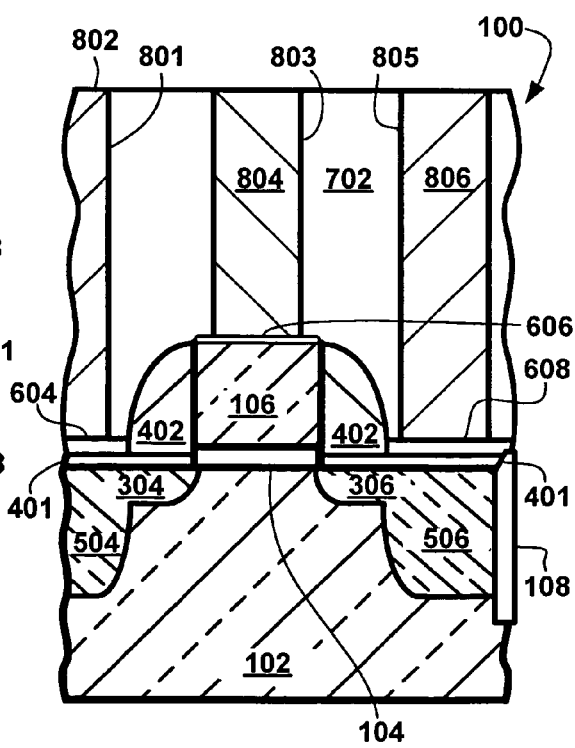
FIG. 8 is the structure of FIG. 7 after formation of metal contacts.

Referring now to FIG. 8 therein is shown the structure of FIG. 7 after formation of metal contacts 802, 804, and 806. The dielectric layer 702 is etched to form trenches into which the metal contacts 802, 804, and 806 are to be formed over the silicide layers 604, 606, and 608, respectively. The etch process includes masking the dielectric layer with a photoresist layer that is processed to form a mask for the metal contact areas over the silicide layers 604, 606, and 608.

The metal contacts 802, 804, and 806 are respectively electrically connected to the silicide layers 604, 606, and 608 after the post contact etch cleaning process, and respectively to the deep source/drain junction 504, the gate 106, and the deep source/drain junction 506.

In various embodiments, the metal contacts 802, 804, and 806 are of metals such as tantalum (Ta), titanium (Ti), tungsten (W), alloys thereof, and compounds thereof. In other embodiments, the metal contacts 802, 804, and 806 are of metals such as copper (Cu), gold (Au), silver (Ag), alloys thereof, and compounds thereof with one or more of the above elements with diffusion barriers around them.

Referring now to FIG. 9, therein is shown a simplified flow chart of a method 900 in accordance with the present invention. The method 900 includes: providing a semiconductor substrate in a step 902; forming a gate dielectric on the semiconductor substrate in a step 904; forming a gate over the gate dielectric in a step 906; forming source/drain junctions in the semiconductor substrate in a step 908; forming a thin insulating layer over the source/drain junctions in a step 910; forming a silicide on the thin insulating layer and on the gate in a step 912; depositing an interlayer dielectric above the semiconductor substrate in a step 914; and forming contacts in the interlayer dielectric to the silicide in a step 916.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters hither-to-fore set forth or shown in the accompanying drawings are to be interpreted in an illustrative and non-limiting sense.

The invention claimed is:

1. A method of forming an integrated circuit comprising:
providing a semiconductor substrate;
forming a gate dielectric on the semiconductor substrate;
forming a gate over the gate dielectric;
forming source/drain junctions in the semiconductor substrate;
forming a thin insulating layer having a thickness greater than zero and less than about 25 Angstroms over and in direct contact with the source/drain junctions;
forming a silicide on the thin insulating layer and on the gate;
depositing an interlayer dielectric above the semiconductor substrate; and
forming contacts in the interlayer dielectric to the silicide.

2. The method as claimed in claim 1 wherein:
forming the source/drain junctions comprises forming a liner layer over the source/drain junctions; and
forming the thin insulating layer uses a sputter process in the power range of about 200 to about 250 watts to remove a portion of the liner layer.

3. The method as claimed in claim 1 wherein:
forming the source/drain junctions comprises forming a liner layer over the source/drain junctions; and
forming the thin insulating layer uses an Argon sputter process in the power range of about 30 to about 35 watts to remove a portion of the liner layer.

4. The method as claimed in claim 1 wherein:
forming the silicide forms a silicide of a metal of at least one of cobalt, titanium nickel, an alloy thereof, a compound thereof, and a combination thereof.

5. A method of forming an integrated circuit comprising:
providing a semiconductor substrate;
forming a gate dielectric on the semiconductor substrate;
forming a gate over the gate dielectric;
forming a liner layer over the semiconductor substrate;
forming source/drain junctions in the semiconductor substrate through the liner layer;
forming a thin insulating layer over the source/drain junctions;
forming a silicide on the thin insulating layer and on the gate;
depositing an interlayer dielectric above the semiconductor substrate; and
forming contacts in the interlayer dielectric to the silicide.

6. The method as claimed in claim 5 wherein:
forming the thin insulating layer forms a layer having a thickness greater than zero and less than about 25 Angstrorms.

7. The method as claimed in claim 5 wherein:
forming the thin insulating layer uses a sputter process in the power range of about 200 to about 250 watts to remove a portion of the liner layer.

8. The method as claimed in claim 5 wherein:
forming the thin insulating layer uses an Argon sputter process in the power range of about 30 to about 35 watts to remove a portion of the liner layer.

9. The method as claimed in claim 5 wherein:
forming the silicide forms a silicide of a metal of at least one of cobalt, titanium, nickel, an alloy thereof, a compound thereof, and a combination thereof.

10. An integrated circuit comprising:
a semiconductor substrate;
a gate dielectric on the semiconductor substrate;
a gate over the gate dielectric;
source/drain junctions in the semiconductor substrate;
a thin insulating layer having a thickness greater than zero and less than about 25 Angstroms over and in direct contact with the source/drain junctions;
a silicide on the thin insulating layer and on the gate;
an interlayer dielectric above the semiconductor substrate; and
contacts in the interlayer dielectric to the silicide.

11. The integrated circuit as claimed in claim 10 wherein:
the contacts to the silicide comprise at least one of tantalum, titanium, tungsten, copper, gold, silver, an alloy thereof, a compound thereof, and a combination thereof.

12. The integrated circuit as claimed in claim 10 wherein:
the interlayer dielectric comprises a dielectric material having a dielectric constant of at least one of medium, low, or ultra-low dielectric constants.

13. The integrated circuit as claimed in claim 10 wherein:
the silicide comprises a silicide of a metal of at least one of cobalt, titanium, nickel, an alloy thereof, a compound thereof, and a combination thereof.

14. A method of reducing diffusion of a silicide in the area of a gate in an integrated circuit having source/drain junctions comprising:
forming a thin insulating layer having a thickness greater than zero and less than about 25 Angstroms over and in direct contact with the source/drain junctions; and
forming the silicide on the thin insulating layer and on the gate.

15. The method as claimed in claim 14 further comprising:
forming a liner layer over the source/drain junctions; and wherein
forming the thin insulating layer uses a sputter process in the power range of about 200 to about 250 watts to remove a portion of the liner layer.

16. The method as claimed in claim 14 further comprising:
forming a liner layer over the source/drain junctions; and wherein
forming the thin insulating layer uses an Argon sputter process in the power range of about 30 to about 35 watts to remove a portion of the liner layer.

17. The method as claimed in claim 14 wherein:
forming the silicide forms a silicide of a metal of at least one of cobalt, titanium, nickel, an alloy thereof, a compound thereof, and a combination thereof.

* * * * *

UNITED STATES PATENT AND TRADEMARK OFFICE
CERTIFICATE OF CORRECTION

PATENT NO. : 7,049,666 B1
APPLICATION NO. : 10/859286
DATED : May 23, 2006
INVENTOR(S) : Chiu et al.

It is certified that error appears in the above-identified patent and that said Letters Patent is hereby corrected as shown below:

Column 7
 Claim 6, line 49, delete "Angstrorms" and insert therefor --Angstroms--

Signed and Sealed this

Twenty-second Day of August, 2006

JON W. DUDAS
*Director of the United States Patent and Trademark Office*